(12) United States Patent
Knudsen et al.

(10) Patent No.: US 9,529,171 B2
(45) Date of Patent: *Dec. 27, 2016

(54) HIGH DENSITY PANEL WITH ROTATING TRAY

(71) Applicant: CommScope Technologies LLC, Hickory, NC (US)

(72) Inventors: Clinton M. Knudsen, Saskatoon (CA); Patrick J. Thompson, Prior Lake, MN (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/657,732

(22) Filed: Mar. 13, 2015

(65) Prior Publication Data

US 2015/0309280 A1 Oct. 29, 2015

Related U.S. Application Data

(60) Continuation of application No. 13/210,826, filed on Aug. 16, 2011, now Pat. No. 8,991,623, which is a
(Continued)

(51) Int. Cl.
*A47F 7/00* (2006.01)
*G02B 6/44* (2006.01)
(Continued)

(52) U.S. Cl.
CPC ........... *G02B 6/4455* (2013.01); *G02B 6/3825* (2013.01); *G02B 6/4452* (2013.01); *G02B 6/4453* (2013.01);
(Continued)

(58) Field of Classification Search
CPC ....... G02B 6/44; G02B 6/4401; G02B 6/4455; G02B 6/3825; G02B 6/4452; G02B 6/4453; G02B 6/4478; H04Q 1/021; H04Q 1/06; H04Q 1/02; H04Q 1/025; H04Q 1/08; H04Q 1/09; H04Q 2201/02; H04Q 2201/14; H04Q 1/062; H05K 7/186; H05K 7/18; A47B 49/004; A47B 53/00; A47B 57/00; A47B 49/006; A47B 63/06; A47B 63/062; A47F 5/02; A47F 5/023; A47F 3/10; G06F 1/181; G06F 1/16
(Continued)

(56) References Cited

U.S. PATENT DOCUMENTS 4,912,615 A 3/1990 Bluband
4,995,681 A 2/1991 Parnell
(Continued)

FOREIGN PATENT DOCUMENTS

DE 43 29 184 A1 3/1995
EP 0 215 668 A2 3/1987
(Continued)

OTHER PUBLICATIONS

ADC Telecommunications, Inc., FL2000 Products Catalog, Literature No. 803, dated Dec. 2000, front cover, table of contents, pp. 1-32, rear cover.
(Continued)

*Primary Examiner* — Jennifer E Novosad
(74) *Attorney, Agent, or Firm* — Merchant & Gould P.C.

(57) ABSTRACT

The present invention relates to a telecommunications termination panel with a tray pivotably mounted within the front opening of a housing. The tray pivots about a hinge located adjacent one of the sides of the housing and includes a raised floor. The raised floor of the tray cooperates with the side adjacent the hinge and a bottom of the housing to define a cable path from a rear cable access port to an opening on the tray adjacent the hinge. The tray includes a plurality of connection locations and cable management structures to direct a telecommunications cable from the cable access port to a rear of the connection locations without violating bend radius rules. The tray may also include a temporary cable holder to assist in pulling cables through the rear opening into the housing. The present invention further relates to a telecommunications equipment rack with a termination panel with such a pivoting tray mounted to the rack.

9 Claims, 22 Drawing Sheets

Related U.S. Application Data continuation of application No. 12/351,337, filed on Jan. 9, 2009, now Pat. No. 8,002,123, which is a division of application No. 11/490,849, filed on Jul. 21, 2006, now Pat. No. 7,478,730, which is a division of application No. 11/326,640, filed on Jan. 6, 2006, now Pat. No. 7,090,084, which is a division of application No. 10/277,606, filed on Oct. 21, 2002, now Pat. No. 7,086,539.

(51) Int. Cl.
  *H04Q 1/06* (2006.01)
  *H05K 7/18* (2006.01)
  *H04Q 1/02* (2006.01)
  *G02B 6/38* (2006.01)

(52) U.S. Cl.
  CPC ............ *G02B 6/4478* (2013.01); *H04Q 1/021* (2013.01); *H04Q 1/06* (2013.01); *H05K 7/186* (2013.01); *H04Q 2201/08* (2013.01); *H04Q 2201/10* (2013.01); *H04Q 2201/804* (2013.01)

(58) Field of Classification Search
  USPC ............ 211/26, 165, 169, 169.1, 168, 126.1, 211/126.15, 131.1, 81; 206/749, 759, 581; 361/683, 727; 108/139, 103; 312/305, 125
  See application file for complete search history.

(56) References Cited

U.S. PATENT DOCUMENTS

| | | |
|---|---|---|
| 5,142,606 A | 8/1992 | Carney et al. |
| 5,339,379 A | 8/1994 | Kutsch et al. |
| 5,402,515 A | 3/1995 | Vidacovich et al. |
| 5,497,444 A | 3/1996 | Wheeler |
| 5,584,396 A * | 12/1996 | Schmitt .................... H05K 7/16 211/26 |
| 5,778,131 A | 7/1998 | Llewellyn et al. |
| 5,946,440 A | 8/1999 | Puetz |
| 6,263,141 B1 | 7/2001 | Smith |
| 6,272,009 B1 | 8/2001 | Buican et al. |
| 6,438,310 B1 | 8/2002 | Lance et al. |
| 6,529,373 B1 | 3/2003 | Liao et al. |
| 6,538,879 B2 | 3/2003 | Jiang |
| 6,591,051 B2 | 7/2003 | Solheid et al. |
| 6,600,665 B2 | 7/2003 | Lauchner |
| RE38,311 E | 11/2003 | Wheeler |
| 6,738,261 B2 | 5/2004 | Vier et al. |
| 6,788,544 B1 | 9/2004 | Barsun et al. |
| 7,079,744 B2 | 7/2006 | Douglas et al. |
| 7,086,539 B2 | 8/2006 | Knudsen et al. |
| 7,090,084 B2 | 8/2006 | Knudsen et al. |
| 7,478,730 B2 | 1/2009 | Knudsen et al. |
| 8,002,123 B2 | 8/2011 | Knudsen et al. |
| 8,991,623 B2 * | 3/2015 | Knudsen ............... G02B 6/4452 211/26 |
| 2002/0179485 A1 | 12/2002 | Shih |
| 2004/0079711 A1 | 4/2004 | Hartman et al. |
| 2004/0251220 A1 | 12/2004 | Mertesdorf et al. |
| 2011/0297629 A1 | 12/2011 | Knudsen et al. |

FOREIGN PATENT DOCUMENTS

| | | |
|---|---|---|
| WO | WO 02/21182 A1 | 3/2002 |
| WO | WO 02/071767 A2 | 9/2002 |

OTHER PUBLICATIONS

ADC Telecommunications, Inc., Next Generation Frame Product Family Ordering Guide, Literature No. 820, dated Apr. 2002, front cover, table of contents, pp. 1-43, rear cover.
European Search Report mailed Sep. 13, 2010.

* cited by examiner

HIGH DENSITY PANEL WITH ROTATING TRAY

CROSS-REFERENCE TO RELATED APPLICATIONS

This application is a continuation of application Ser. No. 13/210,826, filed Aug. 16, 2011, now U.S. Pat. No. 8,991,623, which is a continuation of application Ser. No. 12/351,337, filed Jan. 9, 2009, now U.S. Pat. No. 8,002,123, which is a divisional of application Ser. No. 11/490,849, filed Jul. 21, 2006, now U.S. Pat. No. 7,478,730, which is a divisional of application Ser. No. 11/326,640, filed Jan. 6, 2006, now U.S. Pat. No. 7,090,084, which is a divisional of application Ser. No. 10/277,606, filed Oct. 21, 2002, now U.S. Pat. No. 7,086,539, which applications are incorporated herein by reference in their entirety.

FIELD OF THE INVENTION

The present invention relates to telecommunications termination panels with pivoting bulkheads.

BACKGROUND OF THE INVENTION

In telecommunications infrastructure installations, equipment for switching, cross-connecting and inter-connecting a variety of panels is used. Many of these panels are installed in telecommunications equipment racks to permit organized, high-density installations to be achieved in limited space available for equipment. Due to the increasing demand for telecommunications system capacity, it is desirable to increase the density of connections within a given space that can be achieved. Commensurate with the demand for increased capacity from the same installation footprint is a desire to improve the organization and handling of the cables used to link the equipment within the installation and the outside plant and facilities cables.

One approach to increasing the density of connections within the same footprint is to increase the number of connections supported within a given panel. Access to these connections within panels of higher densities is necessary for the installation, operation and maintenance of the panels. Preferably, access to any one connection within a panel will not cause unnecessary strain on cables extending from other adjacent connections. Modification of the layout of the interior of these panels to improve connector access is desirable.

SUMMARY OF THE INVENTION

The present invention relates to a telecommunications termination panel with a pivoting tray with a plurality of adapters. The tray is hingedly mounted within the front opening of a housing. Optical fiber cables enter the rear of the housing and extend beneath a raised floor toward the front, entering the tray at an opening adjacent the hinge. The tray includes cable management structures which direct the cables to one side of the adapters. Optical fiber cables may be connected to the other side of the adapters and extended through an opening in the side of the housing adjacent the hinge.

The pivoting tray may include a temporary cable clamp mounted to a rear bulkhead of the tray to aid the loading of additional cables into the panel and connecting these additional cables to the rear of the adapters.

BRIEF DESCRIPTION OF THE DRAWINGS

The accompanying drawings, which are incorporated in and constitute a part of the specification, illustrate several aspects of the present invention and together with the description, serve to explain the principles of the invention. A brief description of the drawings is as follows.

DETAILED DESCRIPTION OF THE PREFERRED EMBODIMENT

Reference will now be made in detail to the exemplary aspects of the present invention that are illustrated in the accompanying drawings. Wherever possible, the same reference numbers will be used throughout the drawings to refer to the same or like parts.

Figure 1:
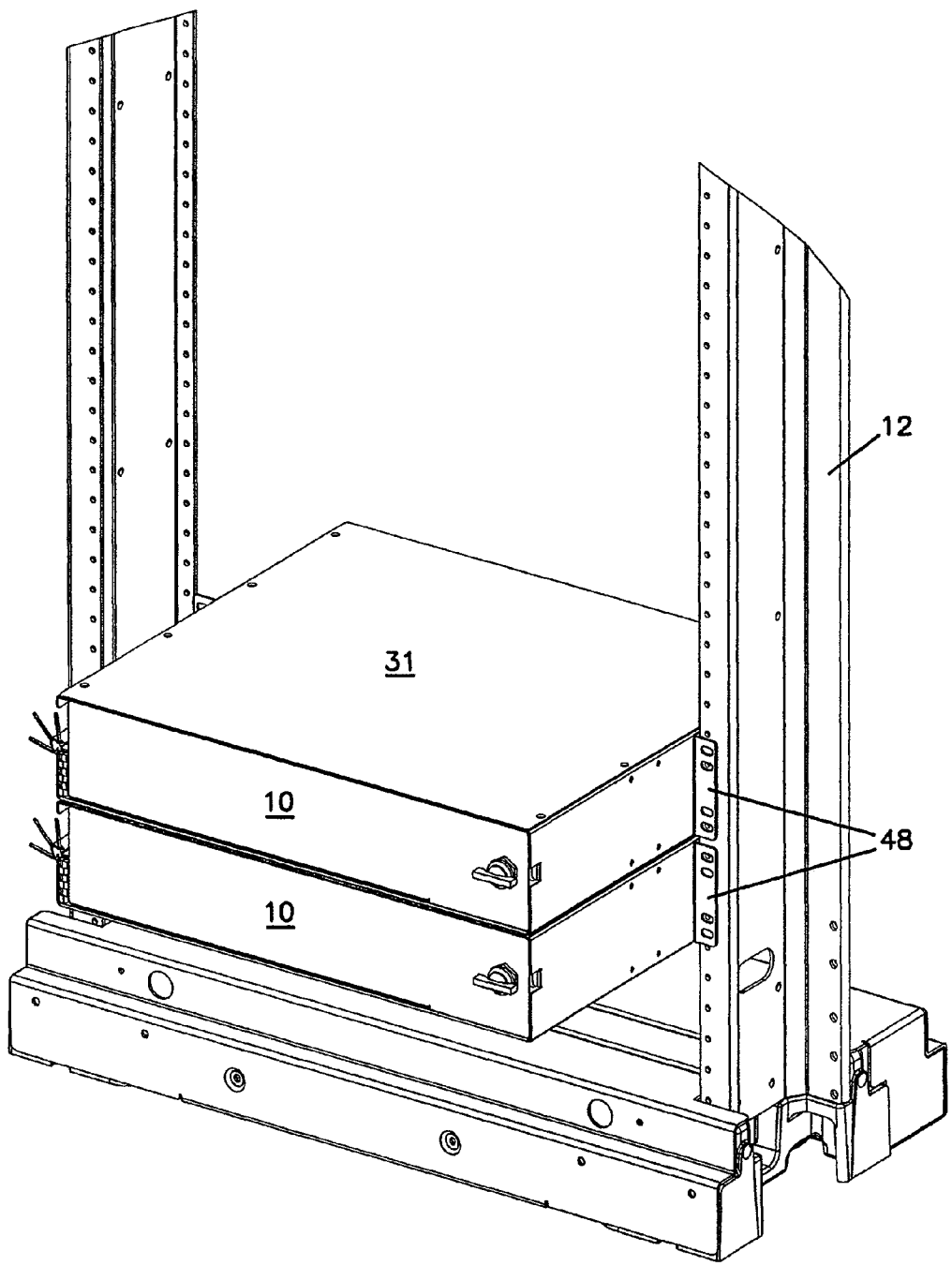
FIG. 1 is a perspective view of a telecommunications equipment rack with two termination panels according to the present invention mounted.

Referring now to the FIGS., telecommunications connections panels 10 provide a plurality of connection locations for linking telecommunications cables within a single panel. These panels 10 may electrically connect copper cables or optically connect optical fiber cables at these connection locations. Such a panel 10 is shown in FIG. 1, mounted to a telecommunications equipment rack 12 adjacent a second panel 10. Additional panels 10 or other telecommunications equipment may also be mounted to rack 12. Rack 12 is shown as a nineteen inch wide rack. It is anticipated that panel 10 could also be adapted for use with a twenty-three inch wide rack or with other widths of racks within the scope of the present invention.

Figure 2:
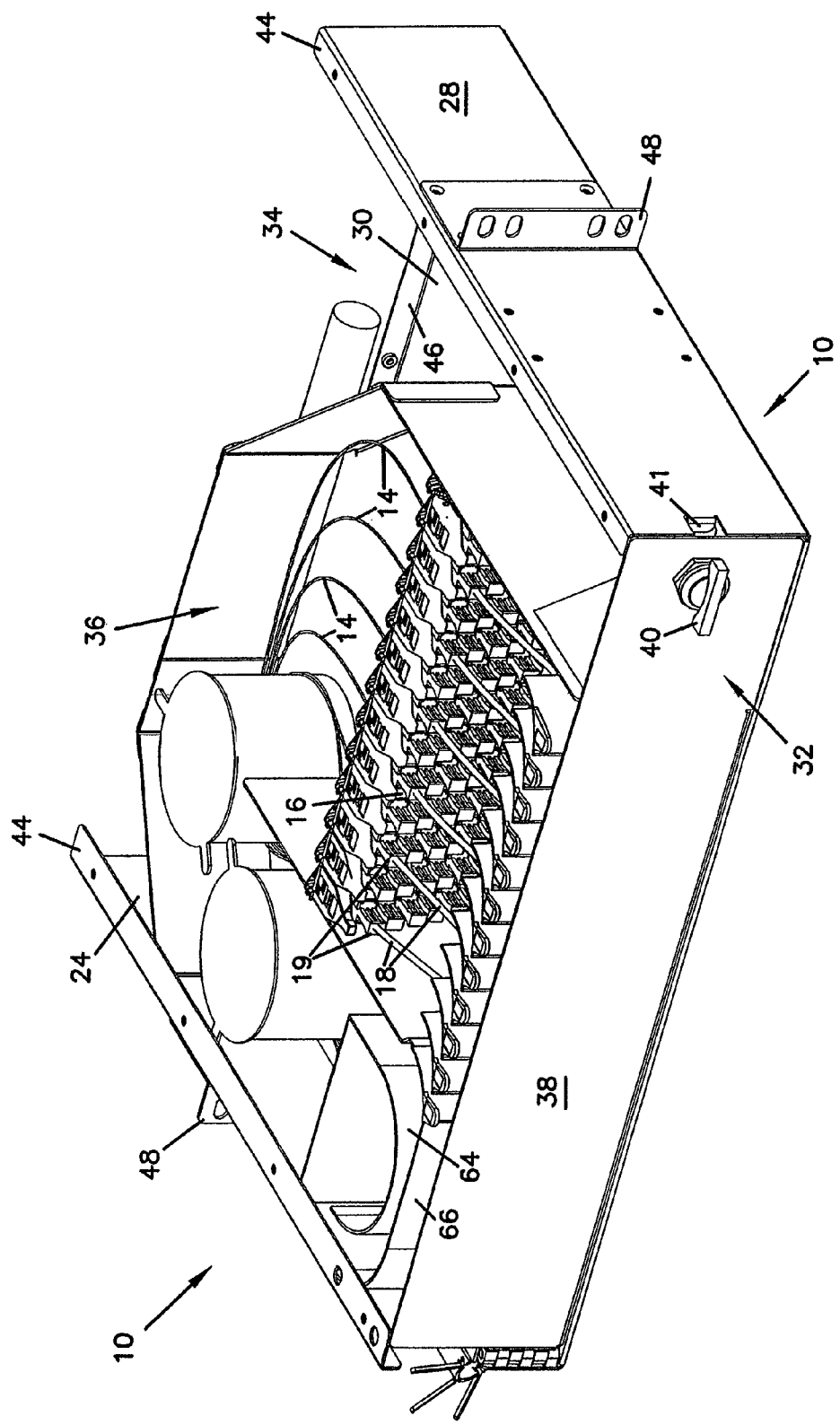
FIG. 2 is a front perspective view of a first embodiment of a termination panel according to the present invention with the top removed for clarity.
Figure 4:
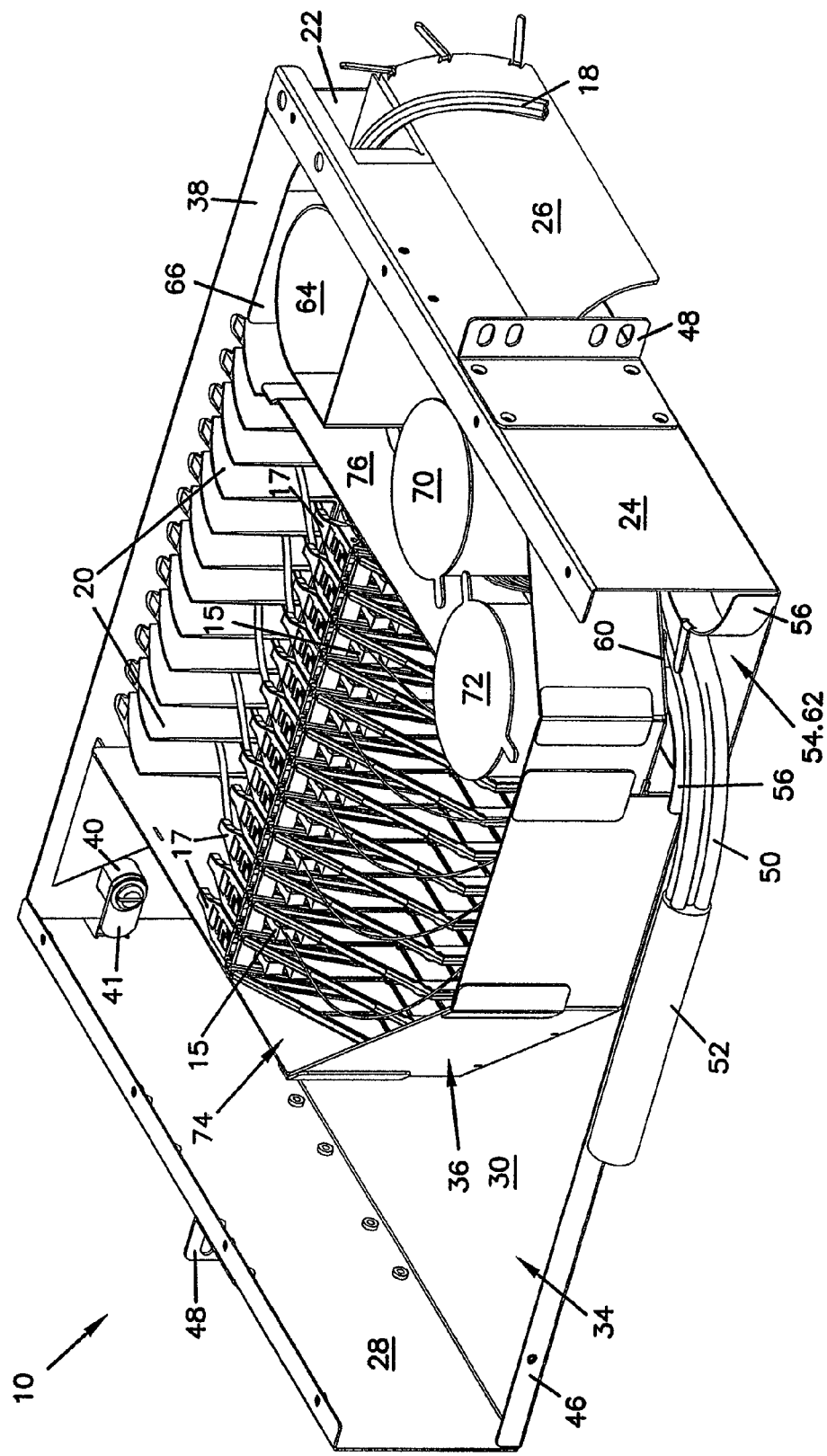
FIG. 4 is a rear perspective view of the termination panel of FIG. 2.

Referring now to FIG. 4, a plurality of optical fiber cables 14 are each terminated by a connector 15. These connectors 15 are connected to a first side or rear of a plurality of connection locations or adapters 16. A plurality of optical fiber patch cords, such as cables 18 are each terminated with a connector 19. These connectors 19 are connected to a second side or front of adapters 16. Adapters 16 align and optically link the optical fiber within a cable 14 with the optical fiber within a cable 18. As seen in FIG. 2, cables 18 extend away from adapters 16, passing through a plurality of vertically oriented fingers 20 which provide bend radius protection as cables 18 are directed toward and through an opening 22 in a side 24 of panel 10. After passing through opening 22, cables 18 may be directed across a ramp 26 (also providing bend radius protection) into an adjacently mounted cableway and extended to other telecommunications equipment.

Figure 3:
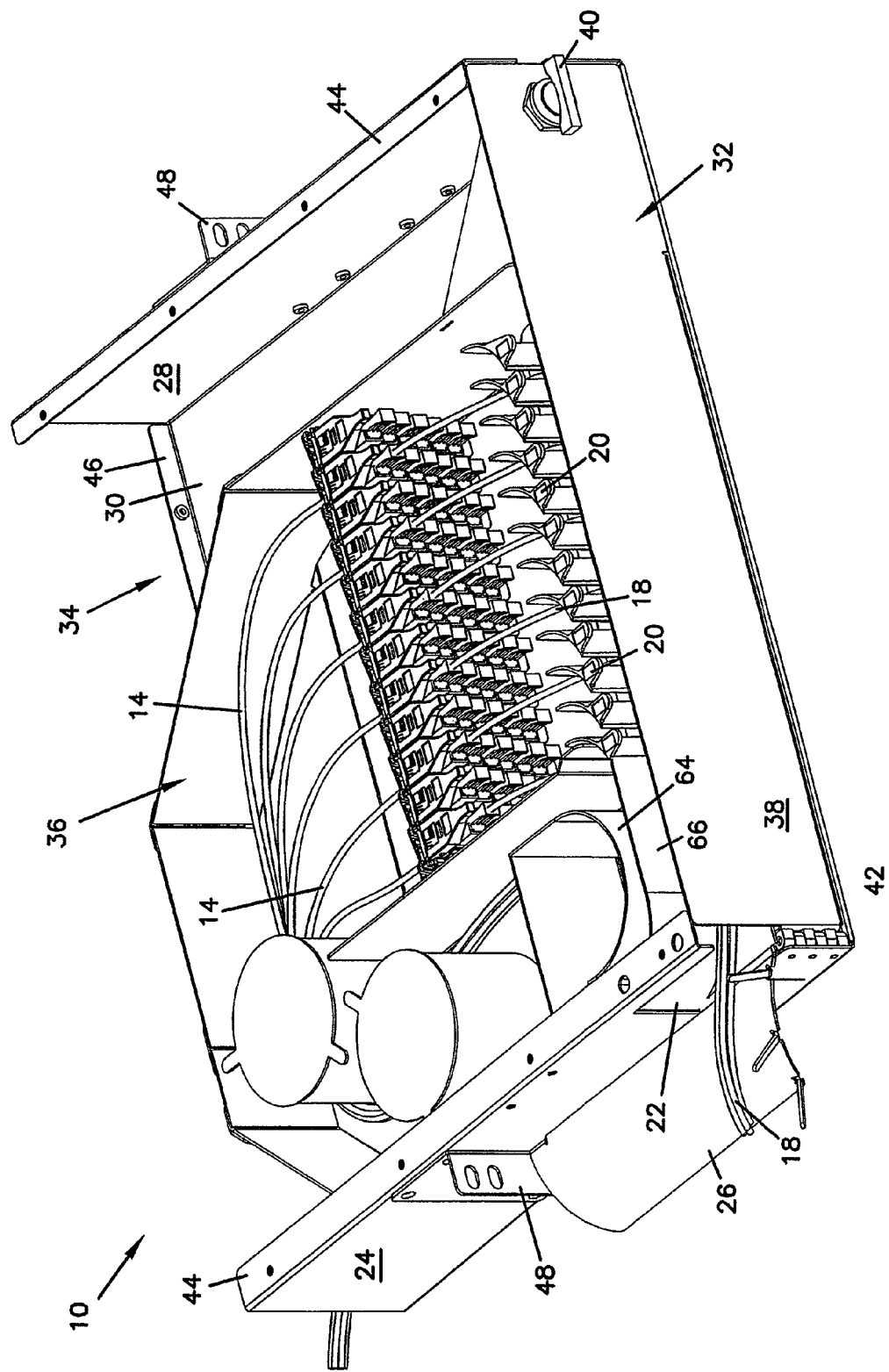
FIG. 3 is a second front perspective view of the termination panel of FIG. 2.

Referring now to FIGS. 2 and 3, panel 10 includes a housing made up of side 24, opposing side 28, and a bottom 30. A top 31 (shown in FIG. 1 and removed from the other drawings for clarity) cooperates with sides 24, 28 and bottom 30 to define a front opening 32 and a rear opening 34. Mounted within front opening 32 is a pivoting tray 36 with a front wall 38 substantially closing off front opening 32, with tray 36 positioned as shown in FIGS. 2 through 6. Tray 36 pivots about an axis defined by a hinge 42 adjacent side 24. Front wall 38 includes a releasable latch 40 opposite hinge 42 which engages tab 41 in side 28 to releasably hold tray 36 in a closed position within front opening 32. Latch 40 as shown is a rotating finger latch. It is anticipated that latch 40 could be a lock requiring a key to release, providing additional security to the interior of panel 10.

Sides 24 and 28 include flanges 44 for mounting top 31 to panel 10. Bottom 30 includes a rear mounting flange 46 so that a rear wall (not shown) can be mounted to substantially close off rear opening 34. Sides 24 and 28 also include mounting brackets 48 along an outer side to aid in mounting panel 10 to rack 12.

Figure 5:
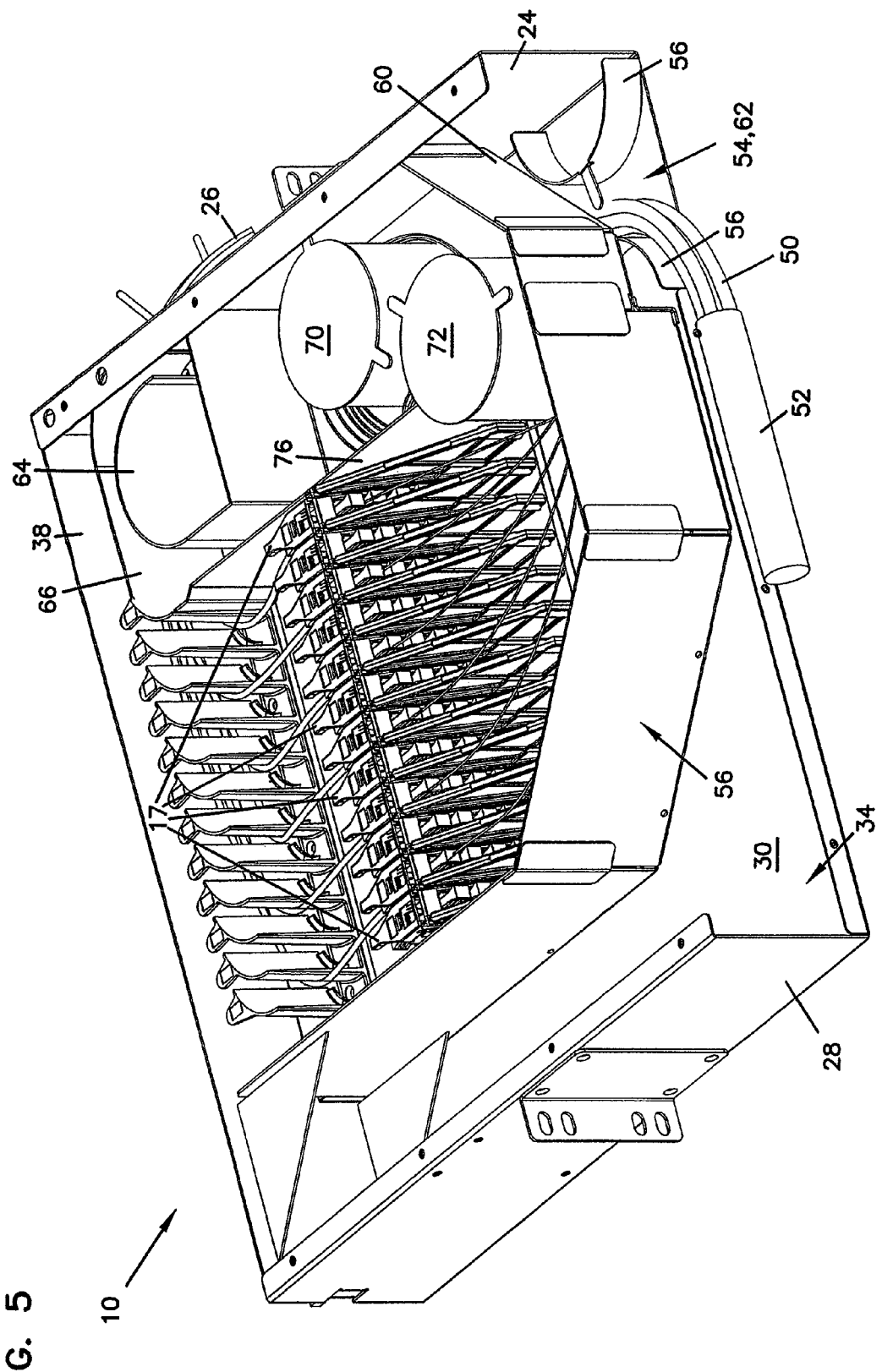
FIG. 5 is a second rear perspective view of the termination panel of FIG. 2.

Referring now to FIGS. 4 and 5, adapters 16 are mounted in a series of parallel, vertically oriented modules 17. As shown in the FIGS., six adapters are mounted in each module 17 and twelve modules 17 are mounted on tray 36. Thus configured, panel 10 is capable of supporting up to seventy-two optical connections between optical fiber cables 14 and patch cords 18. Optical fiber cables 14 enter panel 10 through rear opening 34 within a multi-strand cable such as an inter-facility cable 50. Cable 50 is held to panel 10 by a cable clamp 52 adjacent rear opening 34 and enters panel 10 through a cable access port 54. If a rear wall were mounted to panel 10 to close off rear opening 34, cable access port 54 should remain unobstructed to permit entry of cable 50. Cable 50 includes at least some of optical fibers 14 bundled together in a common casing.

Cable access port 54 includes a pair of opposing bend radius protection curves 56 to ensure that cable 50 (or any other optical fiber cables extending into panel 10 through port 54) are not bent through too tight of a curve as the cables enter port 54. Each curve 56 includes a finger 58 positioned with respect to each other to permit cable 50 to be laid between curves 56 and prevent cable 50 from extending above curves 56. Tray 36 includes a raised floor 60 which is positioned above curves 56, fingers 58 and cable 50. Raised floor 60 cooperates with side 24 and bottom 30 to define a cable path 62. Cable path 62 permits cable 50 to extend through cable access port 54 and into panel 10 along bottom 30 and side 24 in the direction of hinge 42.

Figure 6:
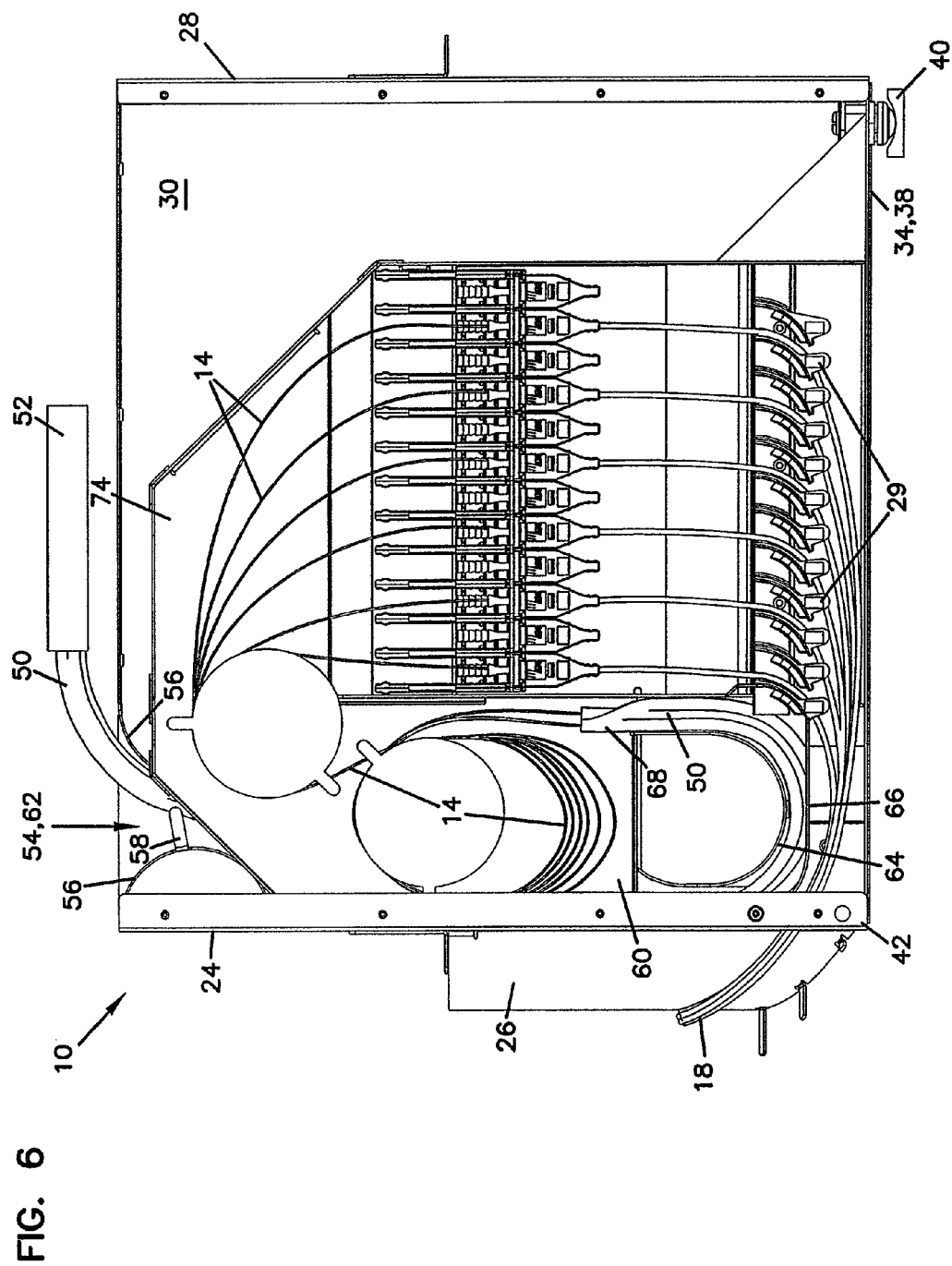
FIG. 6 is a top view of the termination panel of FIG. 2.

Referring now to FIG. 6, cable 50 extends through cable path 62 along side 24 to enter tray 36 adjacent hinge 42, extending up out of cable path 62 and entering tray 36 above raised floor 60. Cable 50 extends between an inner wall 64 and an outer wall 66. Located between walls 64 and 66 is a ramp 65 which lifts cable 50 from beneath raised floor 60 into tray 36 above raised floor 60. Walls 64 and 66 cooperate to carry cable 50 through a semicircular arc without violating bend radius rules. As cable 50 enters tray 36, it is held by an anchor 68. Cable 50 is then broken down into individual fiber cables 14. To ensure that additional slack is available to repair damage to cables 14 without having to adjust the position of cable 50, cables 14 are wrapped around a first drum 70 before extending about a second drum 72 into an area 74 behind adapters 16 within modules 17. From area 74, connectors 15 of cables 14 are connected to adapters 16 which will permit cables 14 to be optically connected to cables 18. Outer wall 66 also provides bend radius protection to cables 18 extending from fingers 20 through opening 22 in side 24 and across ramp 26.

Figure 7:
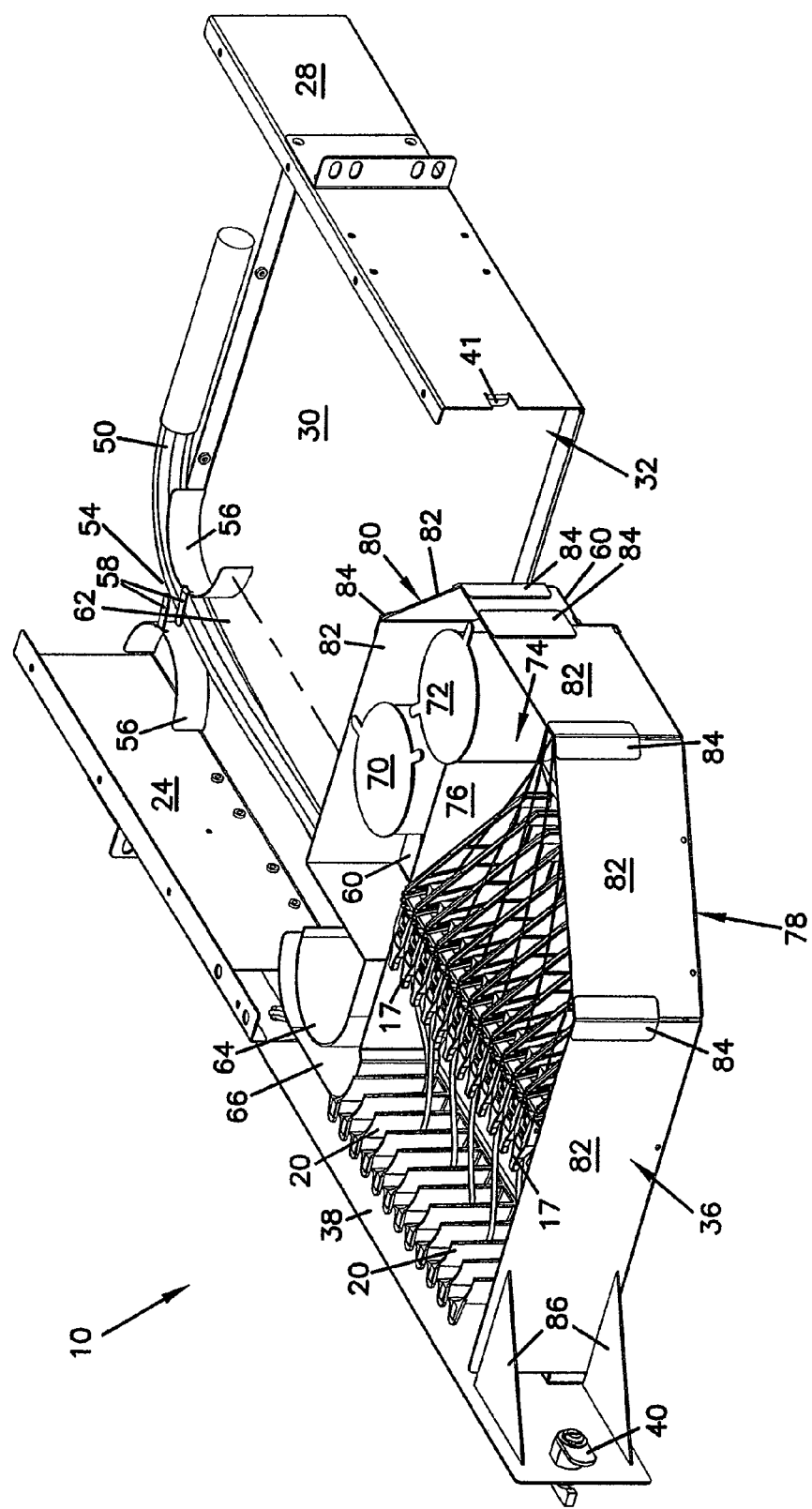
FIG. 7 is a front perspective view of the termination panel of FIG. 2, with the tray swung to an open position allowing access to the connections.
Figure 8:
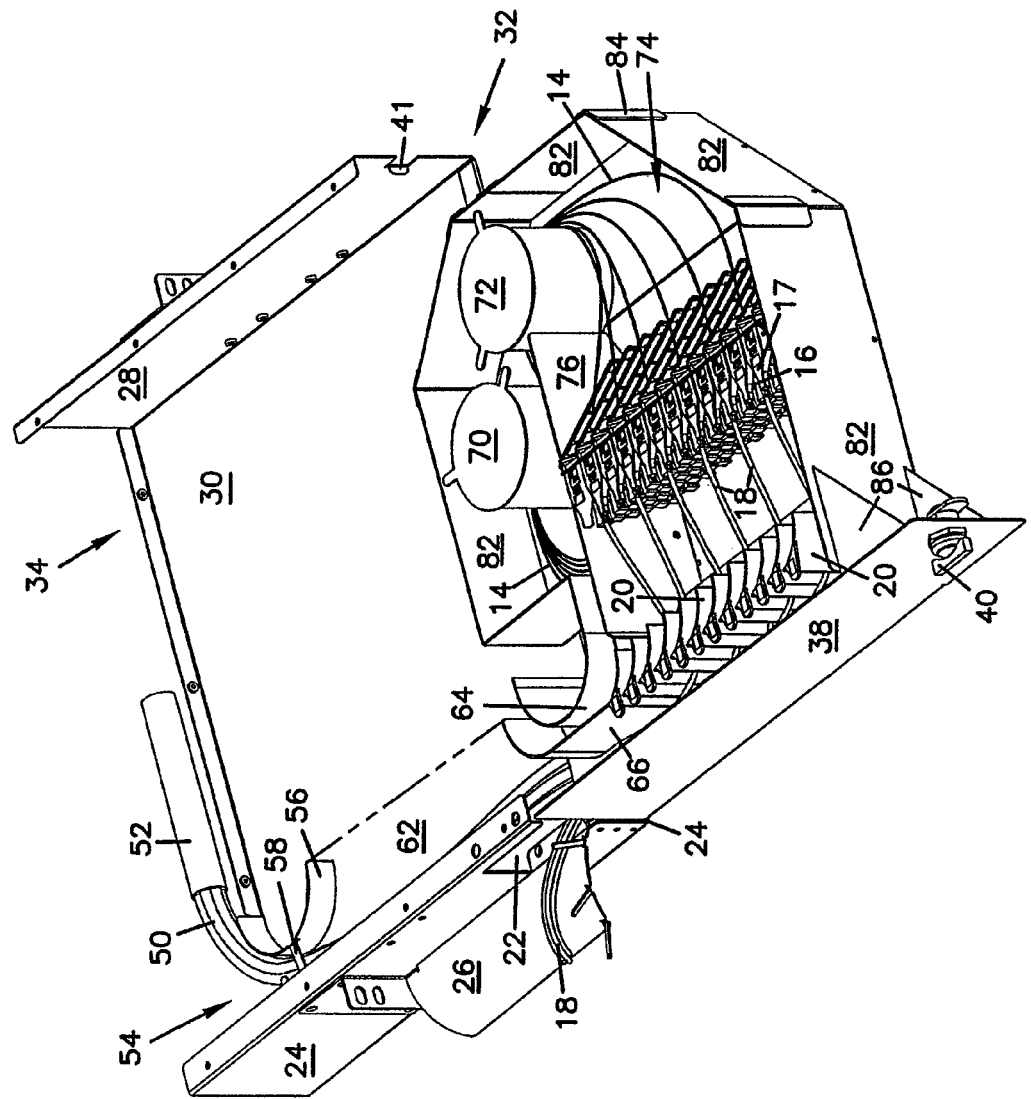
FIG. 8 is a second front perspective view of the termination panel of FIG. 7.
Figure 9:
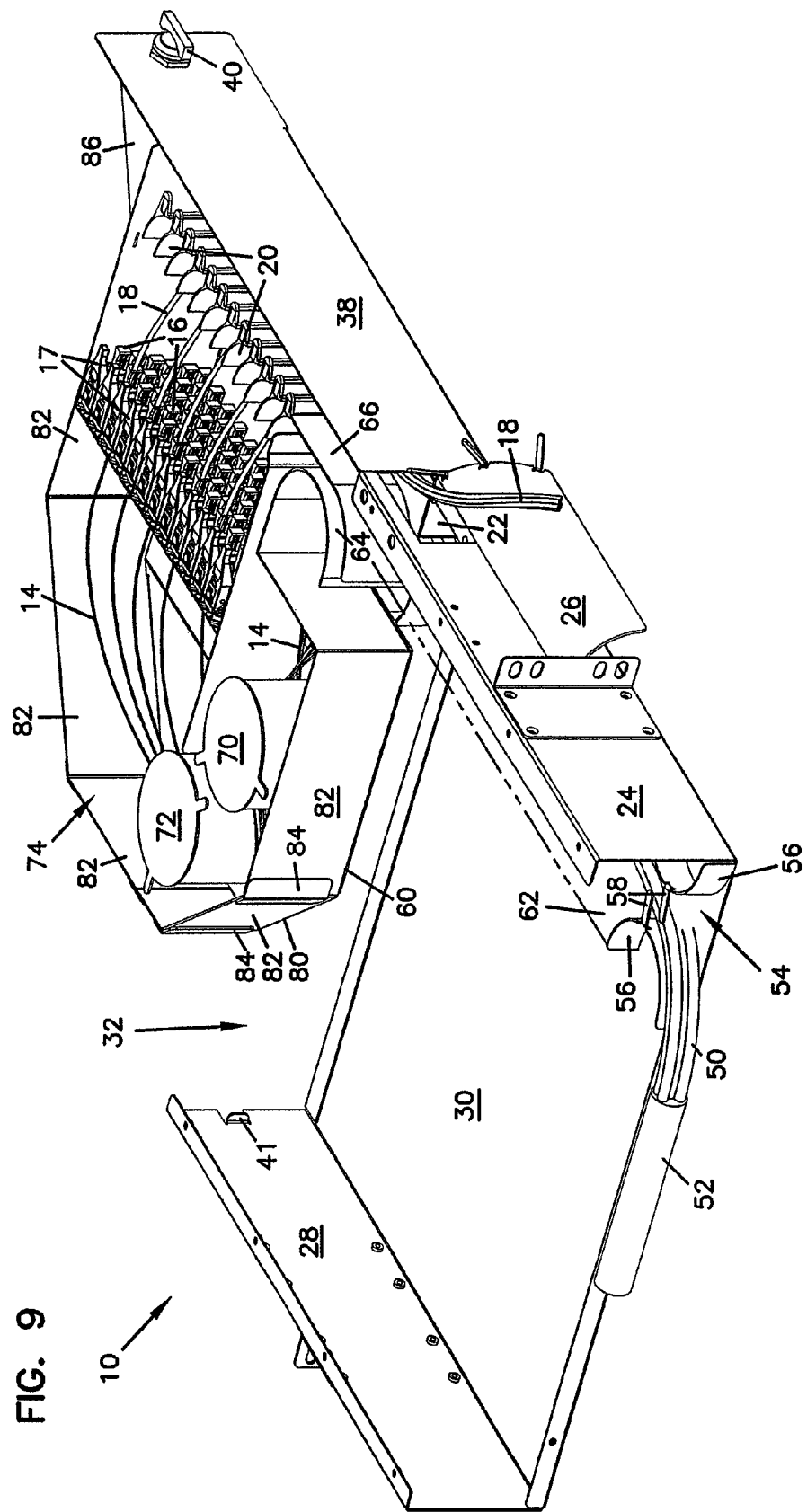
FIG. 9 is a rear perspective view of the termination panel of FIG. 7.

Referring now to FIGS. 7 through 9, a dashed line on bottom 30 indicates the location of cable path 62 along side 24. In these FIGS., tray 36 is swung to an open position about hinge 42 allowing entry into panel 10 through front opening 32. Along an end of tray 36 opposite front wall 38, both corners have been relieved or angled. A first angled corner 78 allows tray 36 to pivot about hinge 42 without being impeded by side 28. A second angled corner 80 allows greater access into panel 10 through front opening 32 between tray 36 and side 28 when tray 36 is in the open position.

Tray 36 includes a plurality of bulkheads 82 along the sides and rear of tray 36, and a central bulkhead 76 separating area 74 from the area above raised floor 60. Bulkheads 82 and 76 cooperate to organize optical fibers 14 and keep optical fibers 14 within tray 36 as tray 36 is swung from the open position shown in FIGS. 7 through 11 to the closed position shown in FIGS. 1 through 6. This will help prevent optical fibers 14 from being pinched or otherwise damaged. A plurality of connectors 84 are located between the various bulkheads 82 to physically connect adjacent bulkheads 82 and reinforce the structure of tray 36. Also reinforcing bulkheads 82 and the overall structure of tray 36 are a pair of triangular gussets 86 connecting a bulkhead 82 to front wall 38 adjacent latch 40.

Figure 10:
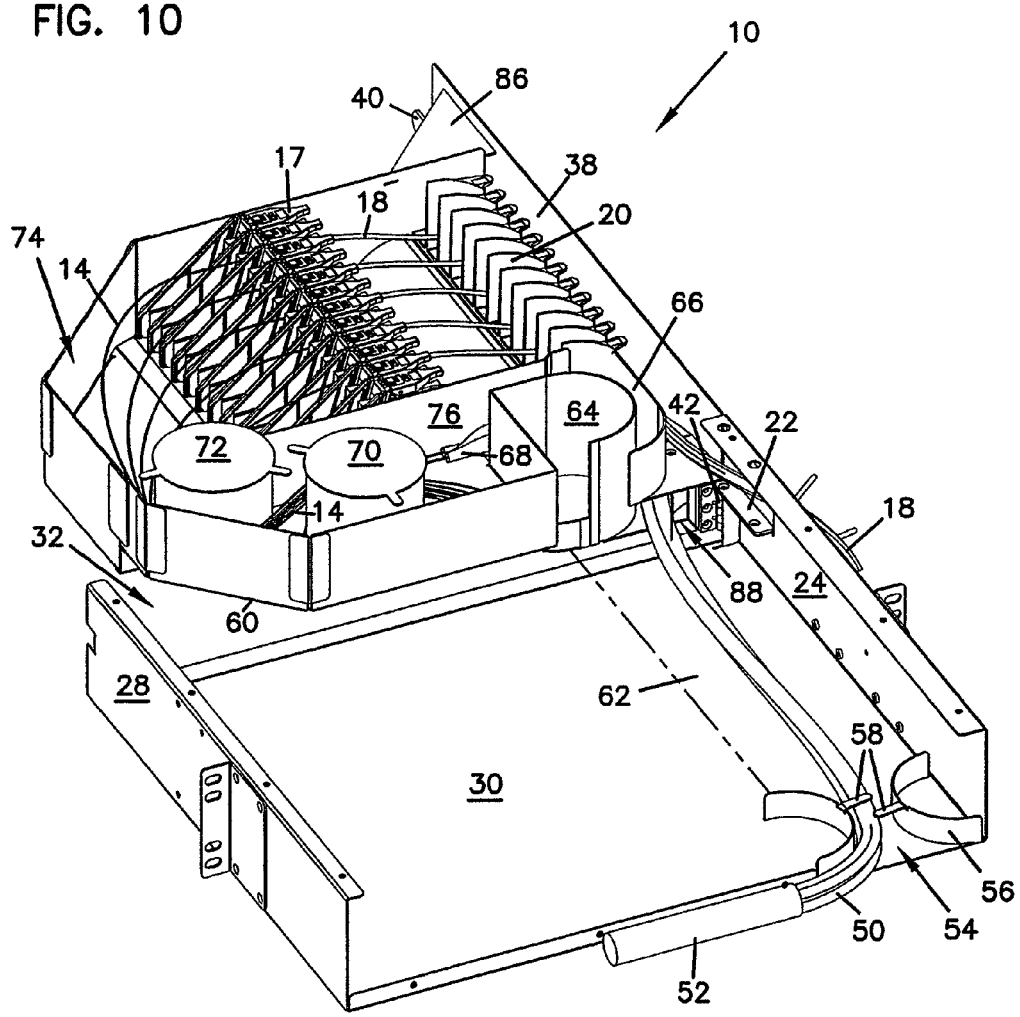
FIG. 10 is a second rear perspective view of the termination panel of FIG. 7.

Referring now to FIG. 10, cable 50 is shown entering tray 36 along ramp 65 between walls 64 and 66 through an opening 88 adjacent hinge 42. Between opening 88 and anchor 68, a ramp elevates cable 50 from the level of bottom 30 to the level of raised floor 60. Positioning opening 88 as close as possible to hinge 42 minimizes the amount of slack required in cable 50 within cable path 62 to permit tray 36 to swing between the open and closed positions. The further from hinge 42 that opening 88 is located, the more slack in cable 50 is required to permit tray 36 to move unhindered.

Similarly, cables 18 from the front of adapters 16 extend around fingers 20 and forward of outer wall 66 to exit through opening 22, which is also positioned as close as possible to hinge 42. This relative location helps reduce the amount of slack required in cables 18 to permit unhindered movement of tray 36.

Figure 11:
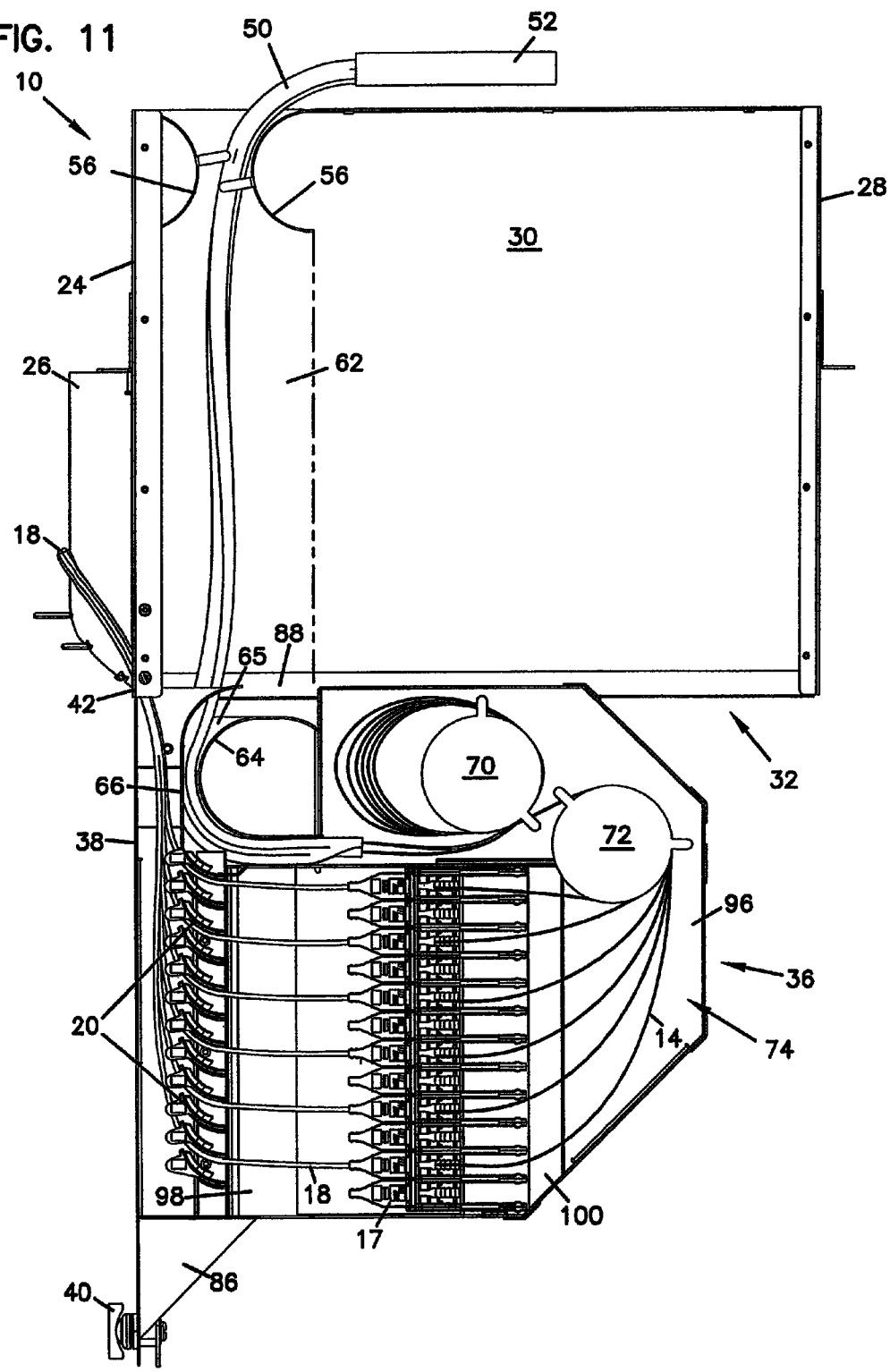
FIG. 11 is a top view of the termination panel of FIG. 7.
Figure 18:
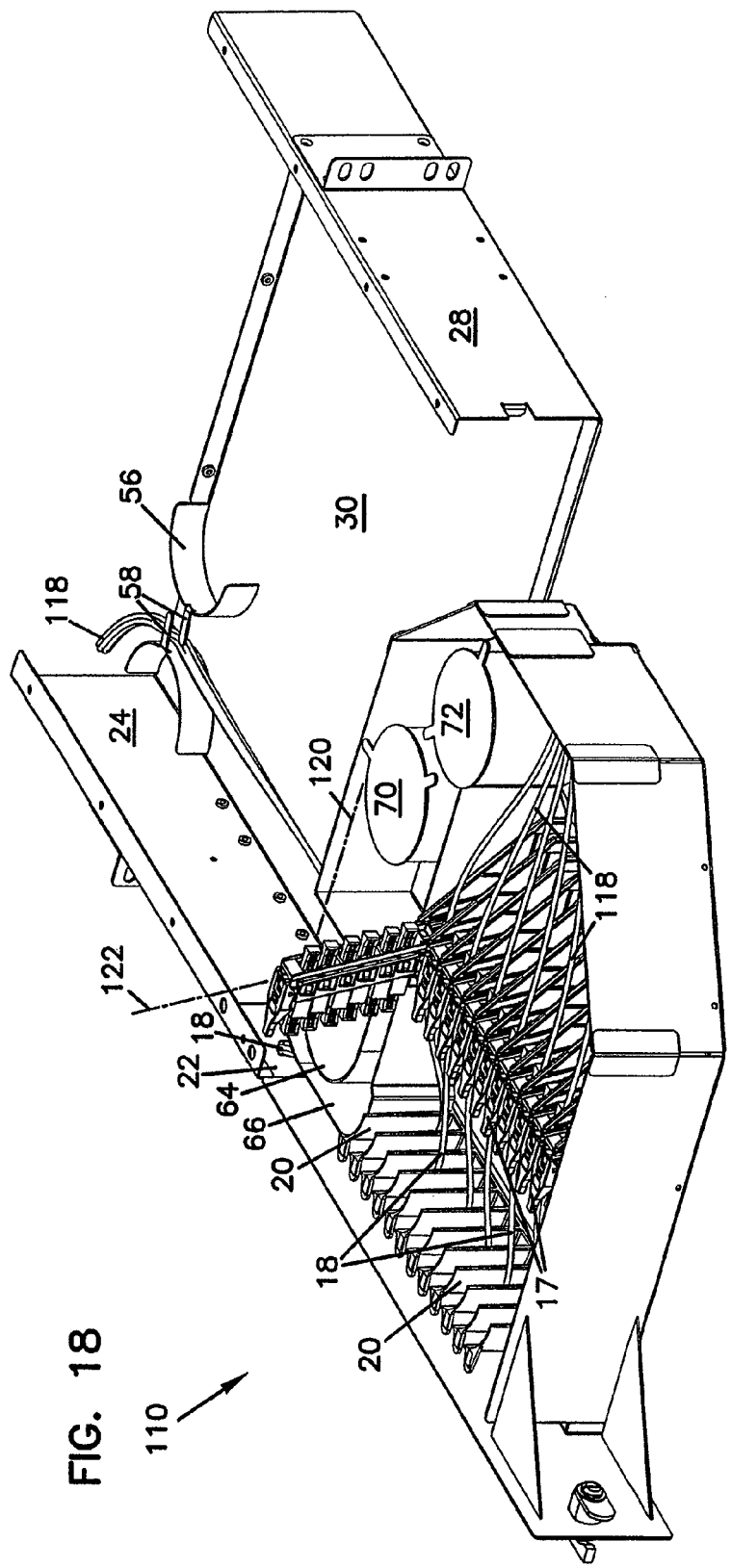
FIG. 18 is a front perspective view of the termination panel of FIG. 13, with the tray swung to an open position allowing access to the connections and one of the sliding connector modules extended upward to provide access to the connections of the modules.
Figure 19:
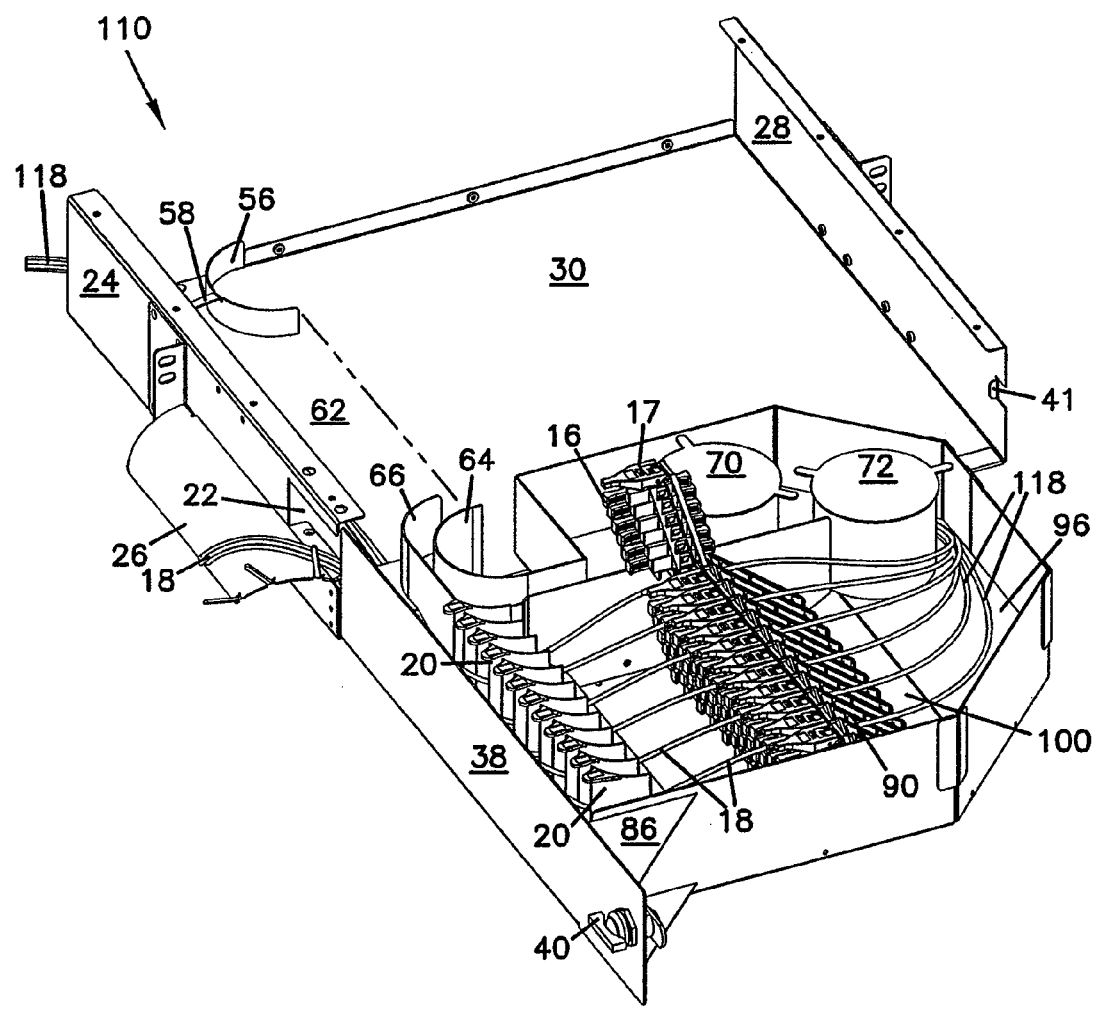
FIG. 19 is a second front perspective view of the termination panel of FIG. 18.
Figure 20:
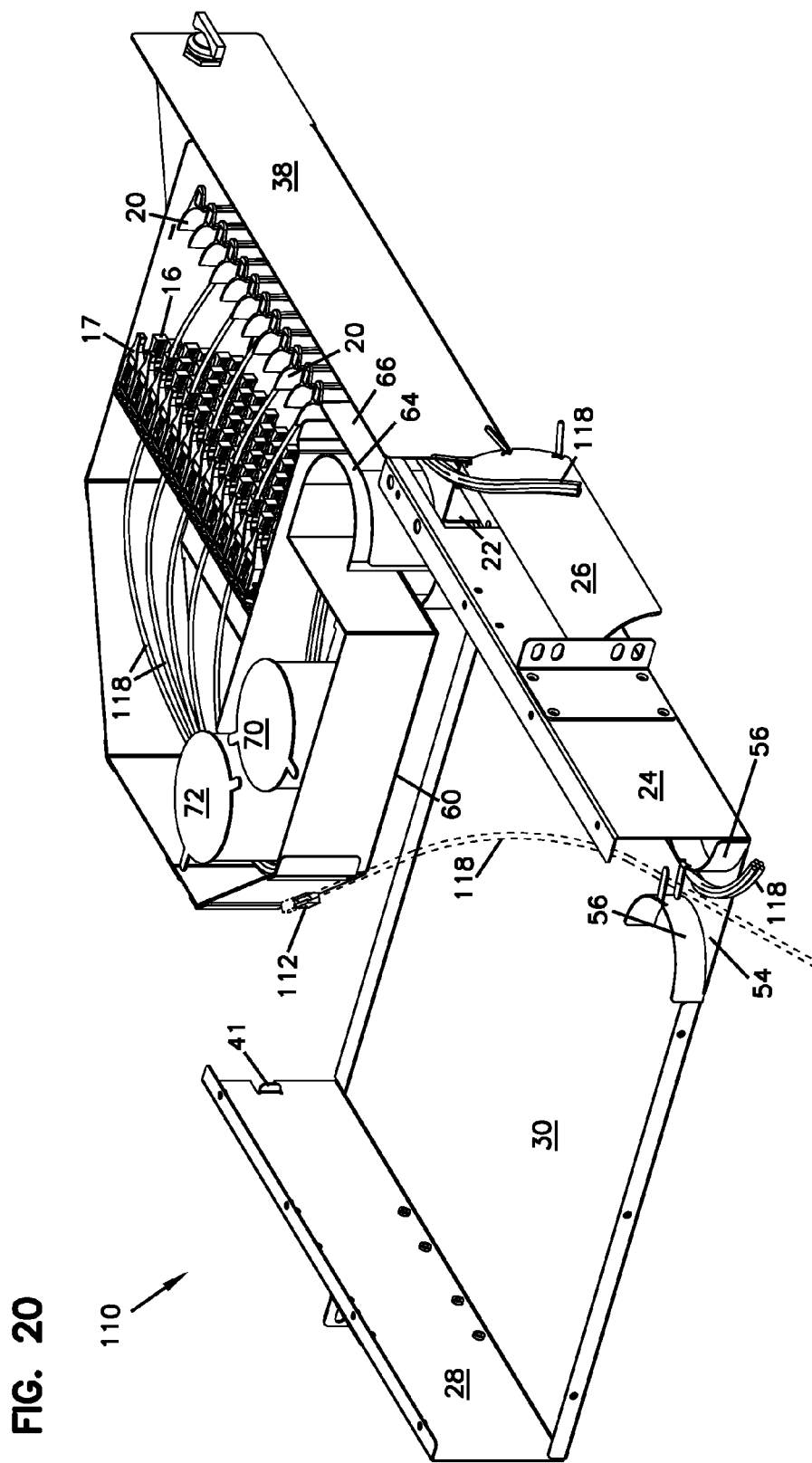
FIG. 20 is a rear perspective view of the termination panel of FIG. 18 with the connector module retracted.

When working with optical fibers within a telecommunications panel, it is desirable that direct viewing down the axis of any optical fibers be avoided. Exposure to the high intensity laser light transmitted through optical fibers can cause significant harm to the vision of a worker subjected to accidental exposure. Orientation of the fiber within a panel or other device so that the axis of the fibers and any adapters is directed away from where a worker would be standing is desirable. Referring now to FIGS. 11 and 18, cables 14, adapters 16, and cables 18 are oriented parallel to the front of panel 10, as indicated by dashed line 120 in FIG. 18, when tray 36 is in the open position. A worker accessing adapters 16 or the cables 14, 18 connected to adapters 16 would most likely be standing directly in front of panel 10 when opening tray 36 and accessing the contents of panel 10. In this arrangement, with tray 36 in the open position, the risk of accidental exposure is reduced.

Figure 12:
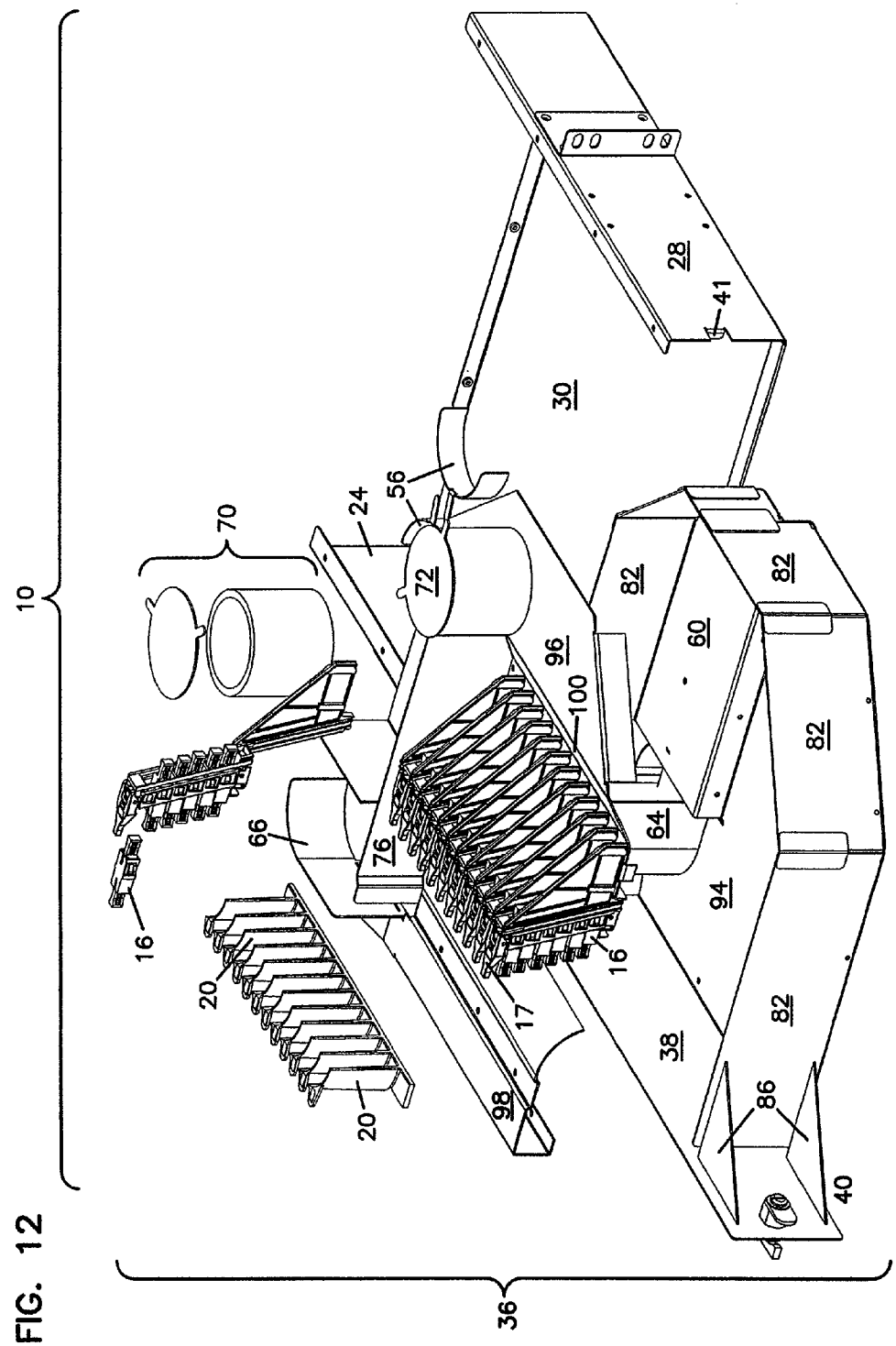
FIG. 12 is a partially exploded view of the termination panel of FIG. 7.
Figure 13:
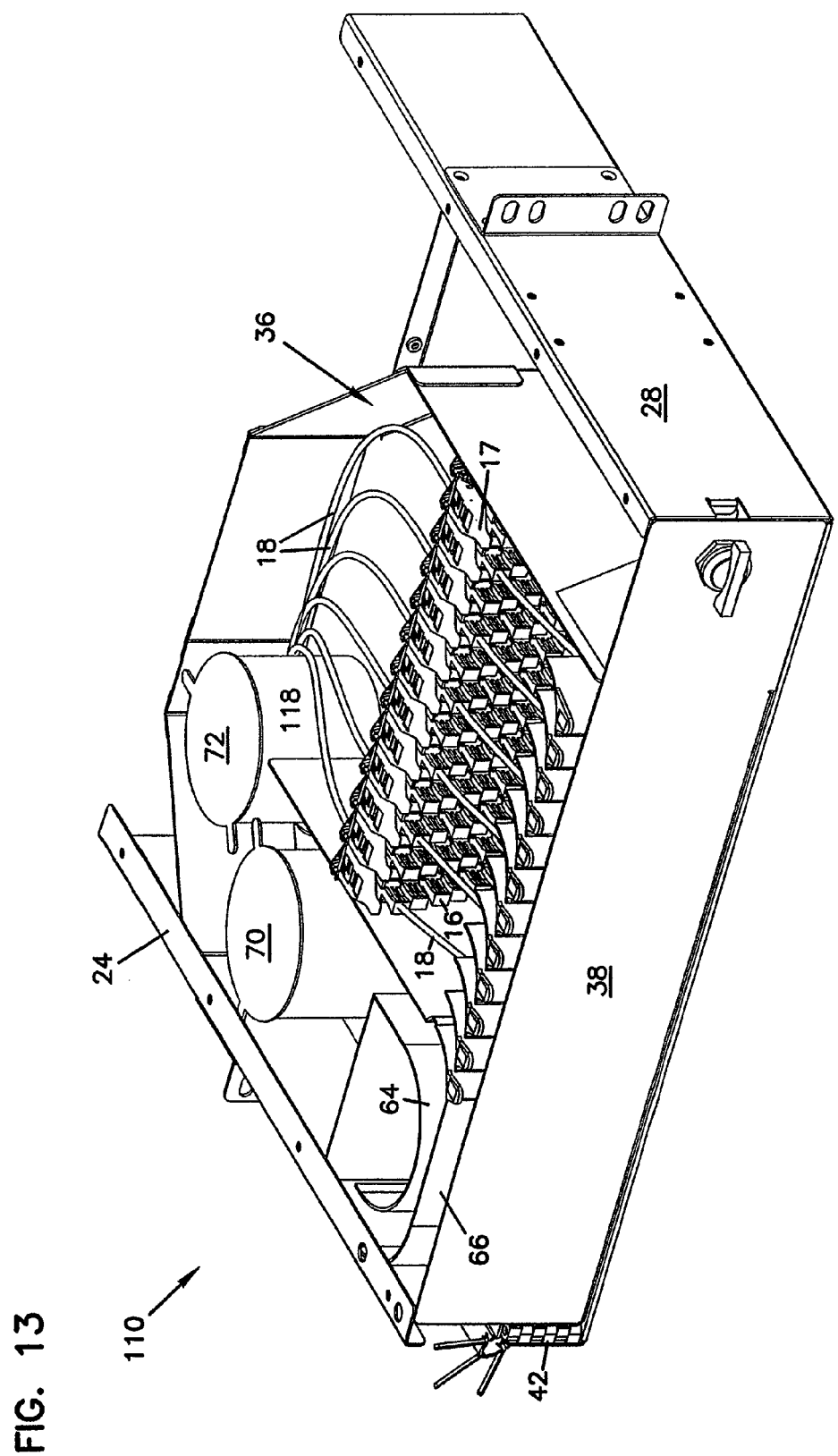
FIG. 13 is a front perspective view of a second embodiment of a termination panel according to the present invention.
Figure 14:
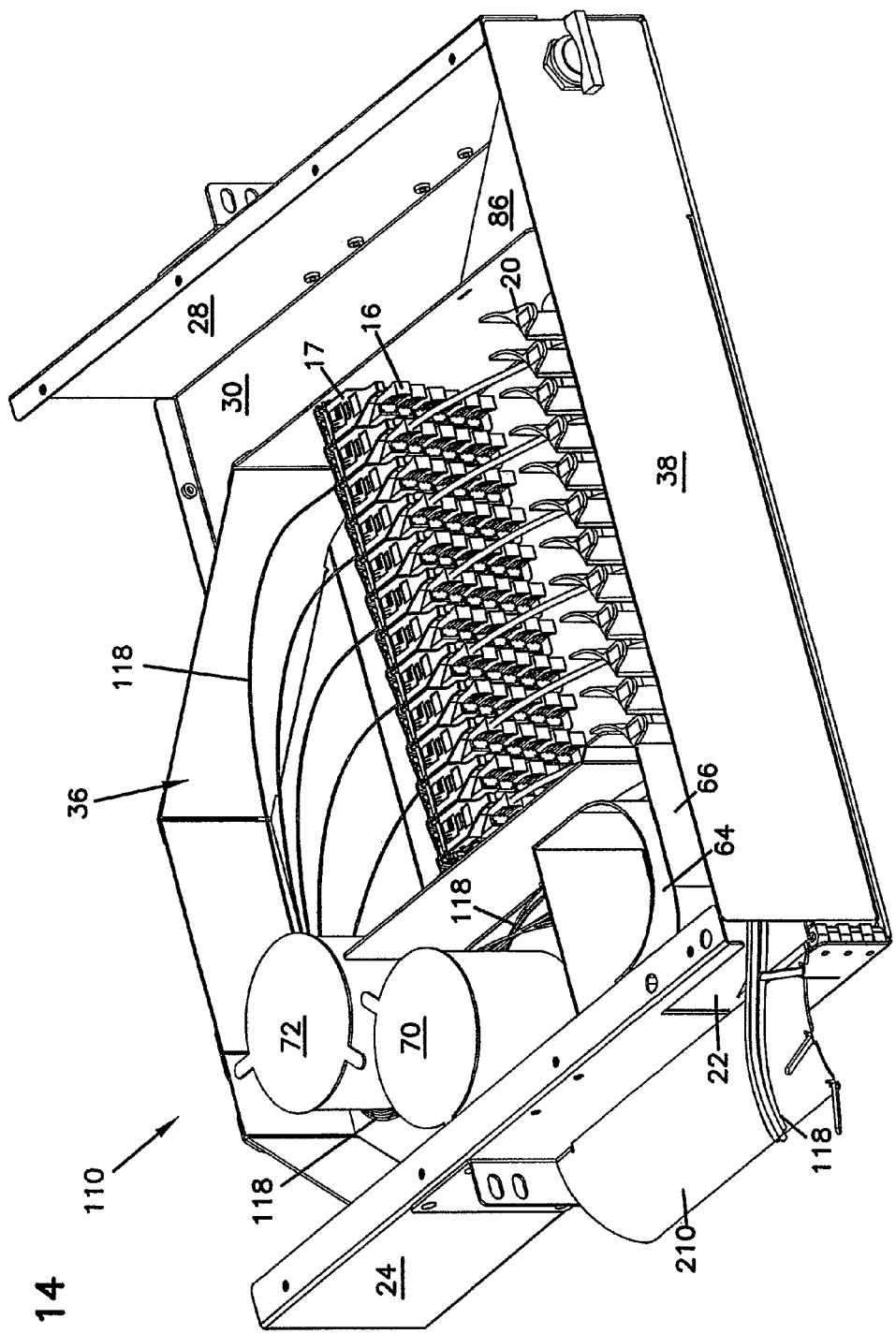
FIG. 14 is a second front perspective view of the termination panel of FIG. 13.

FIG. 12 shows additional detail regarding items mounted to tray 36, including the arrangement of adapters 16 within modules 17. Commonly owned U.S. Pat. Nos. 5,497,444; 5,717,810; 5,758,003; and 6,591,051, the disclosures of which are incorporated herein by reference, further describe and show the structure and features of modules 17. Briefly, each module 17 includes locations for mounting a plurality of adapters 16. As shown also in FIG. 18, discussed in more detail below, each module 17 is slidably mounted between a pair of walls 90 and may be extended generally upward above tray 36, in the direction of dashed line 122 in FIG. 18. Thus positioned, access to adapters 16 mounted to module 17, and any optical fiber cables attached to adapters 16, is improved. Walls 90 are configured to receive a sliding module 17 on each side, so that a total of thirteen walls 90 are required to support the twelve modules 17.

As disclosed in U.S. Pat. No. 6,591,051, and as shown in FIG. 18, modules 17 extend at an angle toward front 38. Adapters 16 are mounted at a corresponding angle to modules 17 so that the axis of insertion of fiber optic cables to the front and rear of each adapter 16 is substantially parallel to floor 94 of tray 36. Alternatively, walls 90 and modules 17 could be configured so that modules 17 slide vertically, with adapters 16 mounted horizontally to modules 17.

Tray 36 includes a floor 94 above which is a second raised floor 96 within area 74 adjacent the rear of adapters 16. As described above, raised floor 60 is offset above bottom 30 of panel 10, and cable path 62 is defined between raised floor 60 and bottom 30 adjacent side 24. Drums 70 and 72 are mounted to raised floor 96, a portion of which extends over raised floor 60. Raised floor 96 includes a ramp 100 extending down to the full depth of floor 94 and leading from area 74 to the rear of adapters 16. Forward of adapters 16 is a transition piece 98, to which are mounted the fingers 20. Cables 18 from the front of adapters 16 extend through and around fingers 20, forward of outer wall 66 and through opening 22 in side 24.

FIGS. 13 through 22 illustrate a second embodiment 110 of a telecommunications connection panel in accord with the present invention. This embodiment is constructed and configured substantially the same as panel 10. The principal difference is that panel 110 has patch cords or cables 118 extending through cable access port 54 instead of cable 50. The routing of cables 118 entering cable access port 54 follows cable path 62 along bottom 30 beneath raised floor 60 to opening 88 adjacent hinge 42. After being directed between walls 64 and 66, cables 118 extend about drum 72 into area 74 adjacent the rear of adapters 16. It is not necessary to pass cables 118 through anchor 68 as cables 118 emerge above raised floor 60. It is also not necessary to pass cables 118 about drum 70 to store slack. If a connector 19 of one of the cables 118 is damaged, the particular cable 118 can be removed and replaced entirely. Alternatively, since cables 118 are not clamped in a bundle by clamp 52, additional length can be pulled into panel 110 for a single cable 118 to be repaired or reterminated without unduly disturbing the other cables 118.

Panel 10 and panel 110 may be configured so that either will accept a multi-strand optical fiber cable such as cable 50 or single strand optical fiber cables such as cables 118 through cable access port 54. The presence of the features such as anchor 68 and first drum 70 for cables 50 do not impair the ability of panel 10 to accept and direct cables 118 to the rear of adapters 16.

Figure 15:
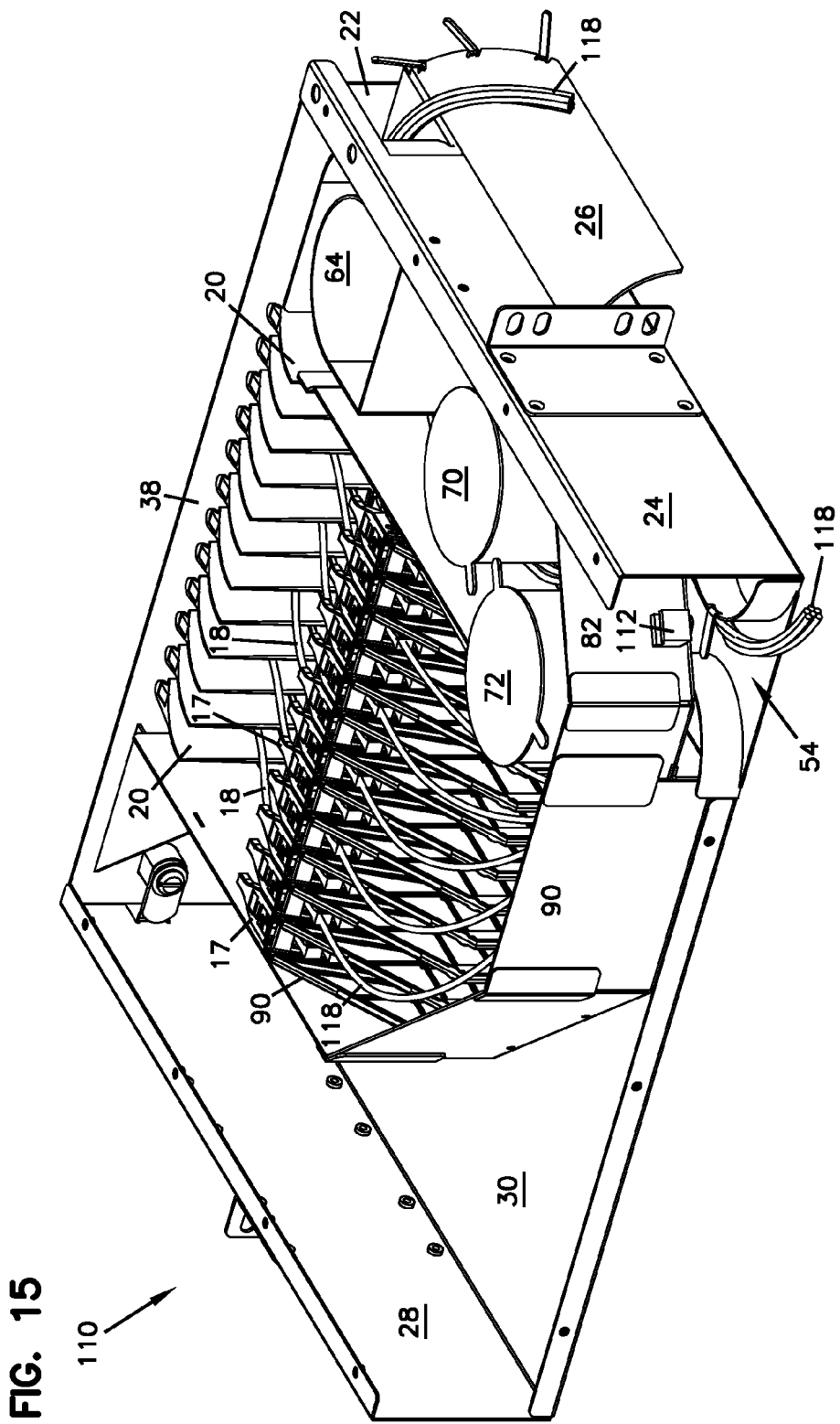
FIG. 15 is a rear perspective view of the termination panel of FIG. 13.
Figure 16:
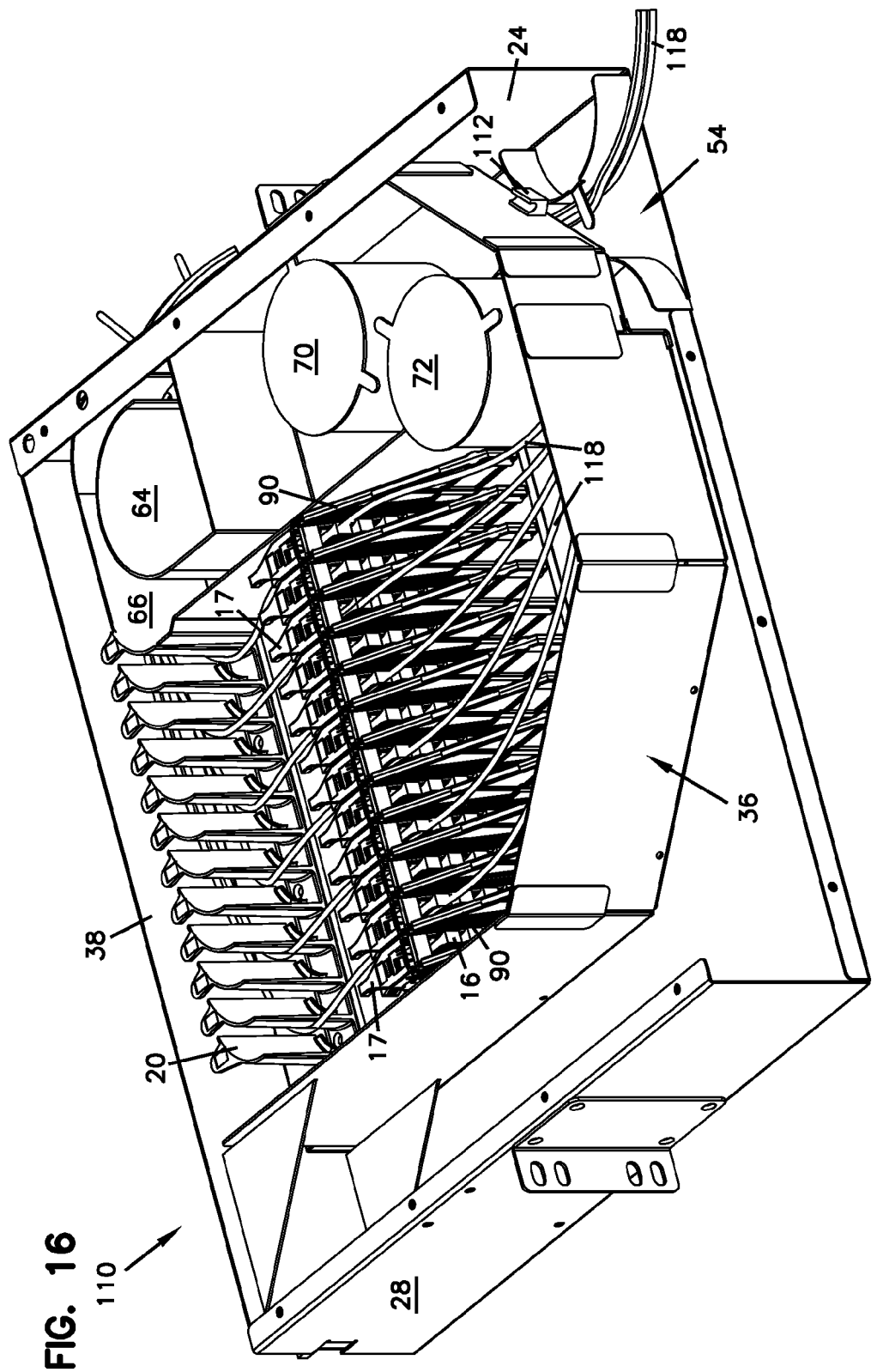
FIG. 16 is a second rear perspective view of the termination panel of FIG. 13.
Figure 17:
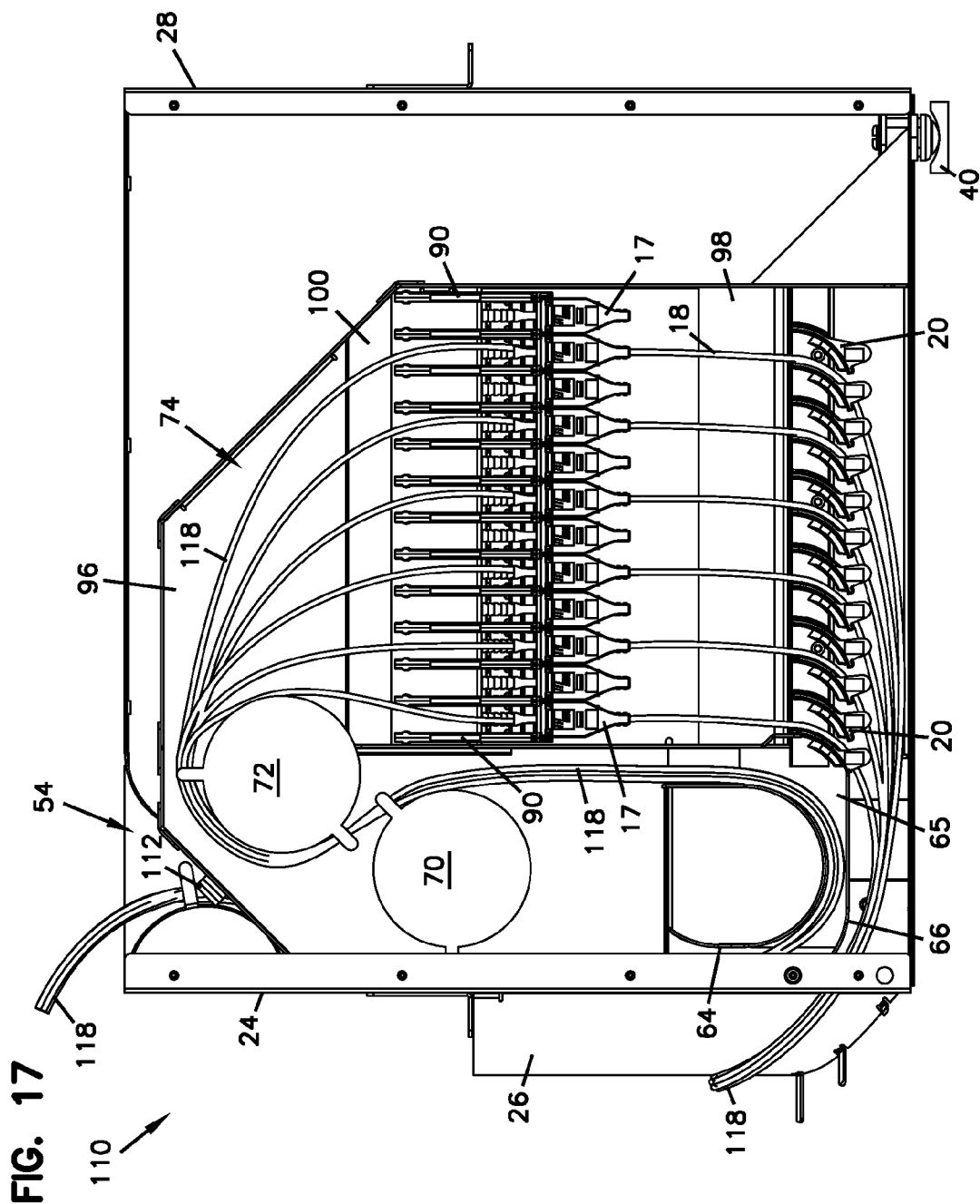
FIG. 17 is a top view of the termination panel of FIG. 13.
Figure 21:
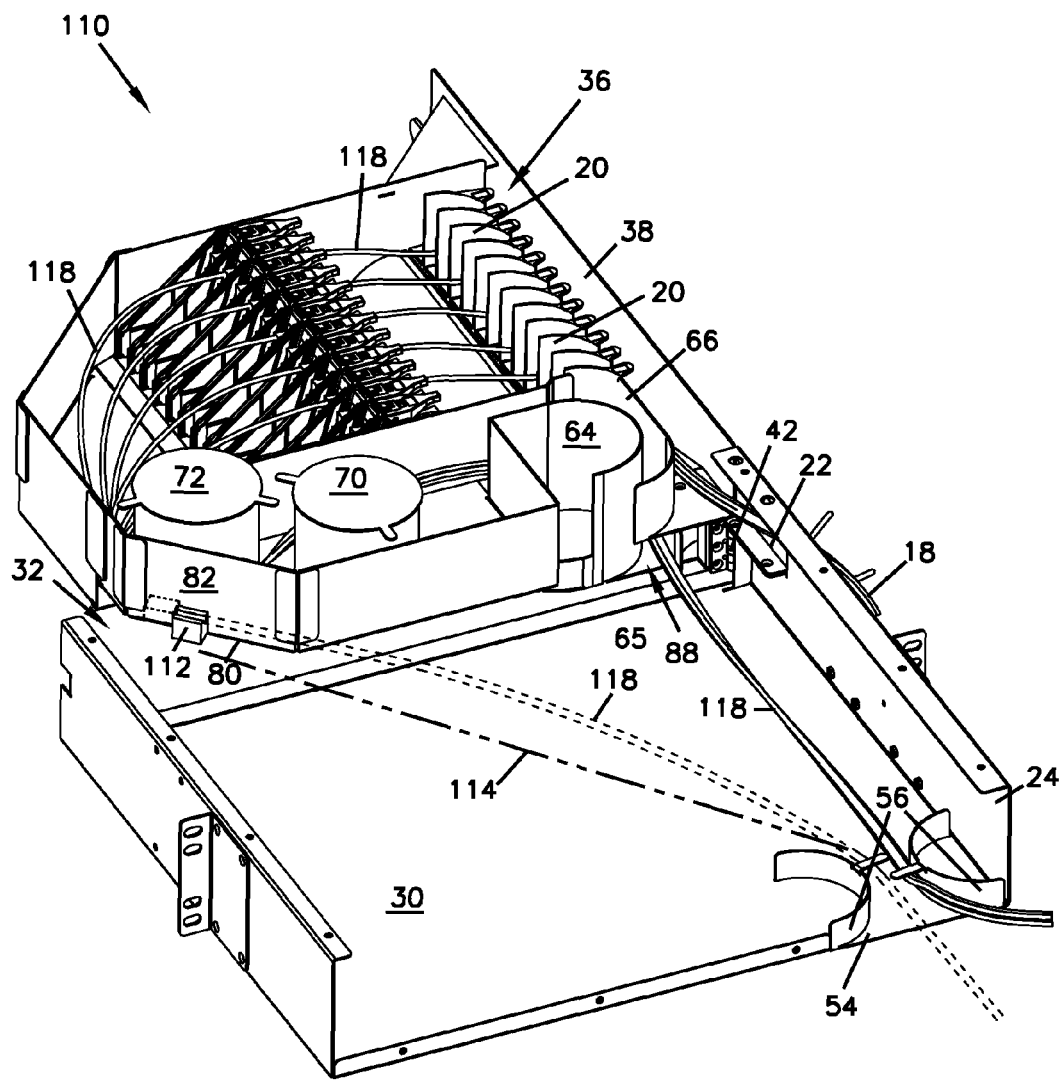
FIG. 21 is a second rear perspective view of the termination panel of FIG. 20.
Figure 22:
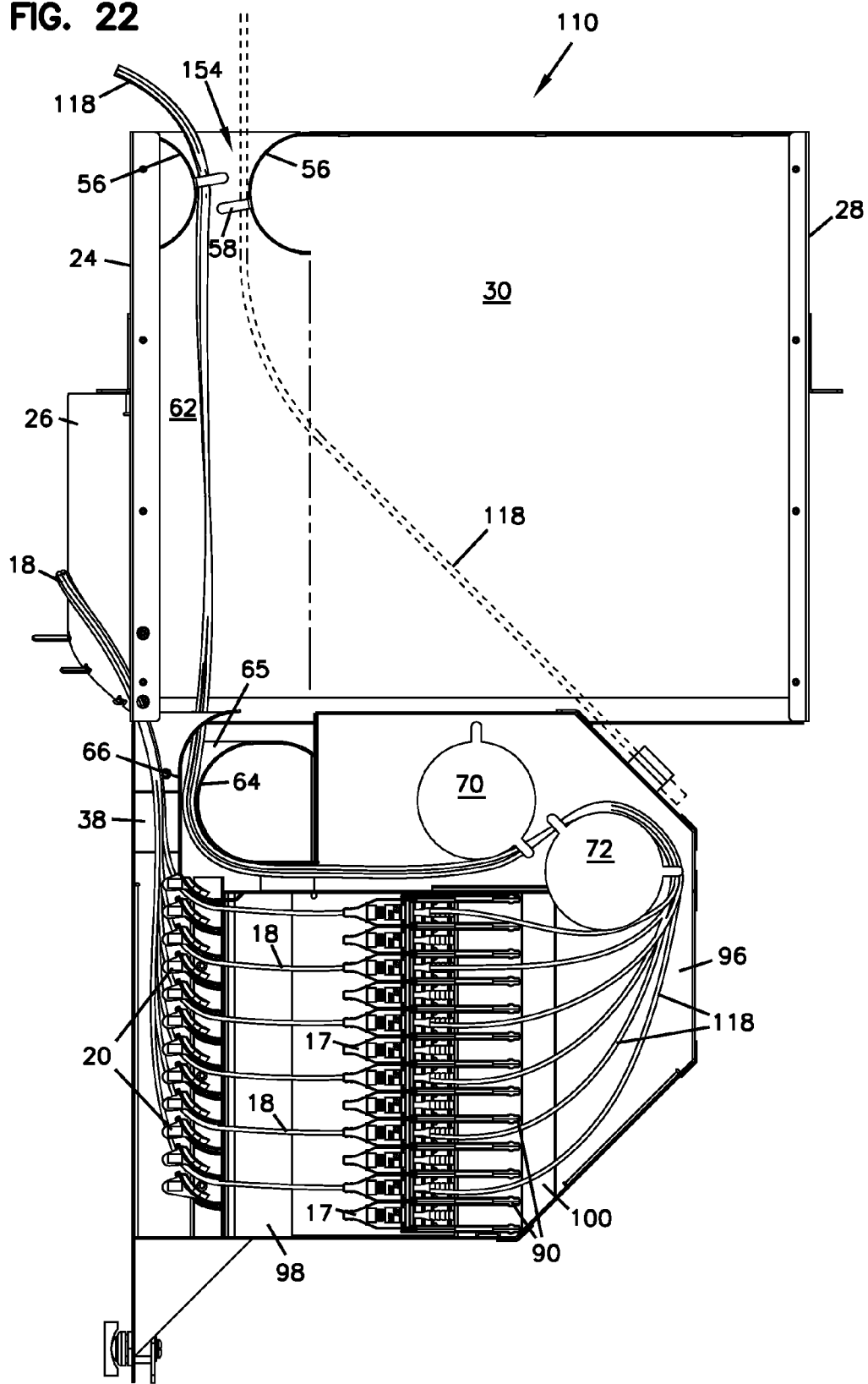
FIG. 22 is a top view of the termination panel of FIG. 20.

Referring now to FIG. 15, mounted to bulkhead 82 along second angled corner 80 of tray 36 is a temporary cable clamp 112. Clamp 112 is directly above cable access port 54 and aids in the loading of cables into tray 36 of panel 110. To load a new cable 118 (or a cable 50) into tray 36 without clamp 112, a worker would need to swing tray 36 to the open position, allowing access through front opening 32 adjacent side 28, as shown in FIG. 21. The worker would then have to reach through opening 32 across the entire diagonal distance of panel 110 to reach the new cable 118 at cable access port 54 adjacent side 24. Panel 110 may be approximately nineteen to twenty-three inches wide between sides and similarly dimensioned front to rear. Reaching across this diagonal distance when panel 110 is mounted within rack 12 may be difficult for some workers, particularly if panel 110 is mounted near the top or bottom of rack 12.

Clamp 112 permits loading of cables 118 into panel 110 without the need to extend an arm through the interior of panel 110. When tray 36 is in the closed position, as shown in FIG. 15, clamp 112 is accessible through cable access port 54. An end of a new cable 118 is lead to cable access port 54 and attached to clamp 112. Tray 36 is then swung to the open position, as shown in FIG. 21. The end of new cable 118 is pulled through panel 110 and out opening 32. As indicated by the dashed line 114 in FIG. 21, new cable 118 extends across the diagonal of bottom 30. New cable 118 can then be detached from clamp 112 and routed through opening 88 into tray 36 along the other cables 118.

It is anticipated that panels 10 and 110 may modified to provide connection locations for high speed copper cables as well as optical fiber cables. As copper cables are used to transmit data at higher speed, bend radius rules similar to those for optical fiber cables need to be enforced within the network. As with optical fiber, it is desirable to have higher densities of connections within copper panels as well.

The above specification, examples and data provide a complete description of the manufacture and use of the invention. Since many embodiments of the invention can be made without departing from the spirit and scope of the invention, the invention resides in the claims hereinafter appended.

What is claimed is as follows:

1. A telecommunications termination panel comprising:
 a housing including a top, a bottom, opposing sides, a front opening, and a rear opening; and
 a tray pivotably mounted to the housing so as to pivot from a closed position, wherein the tray is positioned within the housing, to an open position, wherein the tray is at least partially outside the housing, through the front opening of the housing, pivoting about a vertical axis located adjacent one of the sides and including a plurality of connection locations;

wherein the tray further includes a cable clamp for temporarily attaching an end of a cable through the rear opening to the tray when the tray is in the closed position, and pivotal movement of the tray to the open position allows pulling a cable that has been attached to the clamp through the housing so that the end of the cable can be adjacent to and accessible through the front opening, and wherein a plurality of modules are mounted to the tray with each module movably mounted along a line of travel, each one of the modules including a plurality of adapters for holding a fiber optic connector, each adapter having opposite ends for coupling to a fiber optic connector, each one of the adapters movable with one of the modules along the line of travel, the adapters defining the connection locations.

2. The telecommunications termination panel of claim 1, wherein the tray includes a cable entry adjacent the vertical axis.

3. The telecommunications termination panel of claim 2, wherein the tray further includes a cable management structure for routing optical fiber cables from the cable entry to the connection locations.

4. The telecommunications termination panel of claim 2, wherein the housing includes a cable anchor adjacent the rear opening to anchor at least one multi-fiber fiber optic cable extending through the rear opening.

5. The telecommunications termination panel of claim 4, wherein the cable anchor is oriented horizontally.

6. The telecommunications termination panel of claim 2, wherein the cable entry of the tray includes a bend radius protection structure.

7. The telecommunications termination panel of claim 1, wherein the tray swings through an arc of approximately ninety degrees between the closed and the open positions.

8. The telecommunications termination panel of claim 1, wherein a corner of the tray is relieved to improve access through the front opening into the housing when the tray is in the open position.

9. The telecommunications termination panel of claim 8, wherein the relieved corner of the tray includes the cable clamp for temporarily attaching an end of a cable.

* * * * *